US006830945B2

(12) United States Patent
Moon et al.

(10) Patent No.: US 6,830,945 B2
(45) Date of Patent: Dec. 14, 2004

(54) METHOD FOR FABRICATING A NON-PLANAR NITRIDE-BASED HETEROSTRUCTURE FIELD EFFECT TRANSISTOR

(75) Inventors: Jeong Sun Moon, Chatsworth, CA (US); Paul Hashimoto, Los Angeles, CA (US); Wah S. Wong, Montebello, CA (US); David E. Grider, Charlotte, NC (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 10/386,960

(22) Filed: Mar. 12, 2003

(65) Prior Publication Data

US 2004/0051112 A1 Mar. 18, 2004

Related U.S. Application Data

(60) Provisional application No. 60/411,076, filed on Sep. 16, 2002.

(51) Int. Cl.[7] ............................................... H01L 21/00
(52) U.S. Cl. .............................. 438/22; 438/22; 438/94
(58) Field of Search ........................ 438/22, 94, 172, 438/197, 191, 183, 260, 287

(56) References Cited

U.S. PATENT DOCUMENTS

| | | | |
|---|---|---|---|
| 5,733,806 A | 3/1998 | Grivina et al. | 438/183 |
| 5,847,414 A | 12/1998 | Harris et al. | 257/77 |
| 5,915,164 A | 6/1999 | Taskar et al. | 438/47 |
| 5,990,531 A | * 11/1999 | Taskar et al. | 257/410 |
| 6,140,169 A | 10/2000 | Kawai et al. | 438/197 |
| 6,552,373 B2 | * 4/2003 | Ando et al. | 257/192 |

OTHER PUBLICATIONS

Alekseev, E., et al., "Low Interface State Density AlN/GaN MISFETs," *Electronics Letters*, vol. 35, No. 24, pp. 2145–2146 (Nov. 29, 1999).

Buttari, D., et al., "Systematic Characterization of $Cl_2$ Reactive Ion Etching For Gate Recessing in AlGaN/GaN HEMTs," *IEEE Electron Device Letters*, vol. 23, No. 3, pp. 118–120 (Mar. 3, 2002).

Chang, E.Y., et al., "A GaAs/AlAs Wet Selective Etch Process for the Gate Recess of GaAs Power Metal—Semiconductor Field–Effect Transisitors," *Journal of the Electrochemical Society* , vol. 148, No. 1, pp. G4–G9 (Jan. 2001).

Egawa, Takashi, et al., "Recessed Gate AlGaN/GaN MOD-FET on Sapphire Grown by MOCVD," *Electron Devices Meeting*, Washington, DC, pp. 401–404 (Dec. 5, 1999).

Kawai, H., et al., "AlN/GaN Insulated Gate Heterostructure FET With Regrown $n^+$GaN Ohmic Contact," *Electronics Letters*, vol. 34, No. 6, pp. 592–593 (Mar. 19, 1998).

(List continued on next page.)

*Primary Examiner*—David Nelms
*Assistant Examiner*—Thinh T Nguyen
(74) *Attorney, Agent, or Firm*—Ladas & Parry

(57) ABSTRACT

A method for fabricating a non-planar heterostructure field effect transistor using group III-nitride materials with consistent repeatable results is disclosed. The method provides a substrate on which at least one layer of semiconductor material is deposited. An AlN layer is deposited on the at least one layer of semiconductor material. A portion of the AlN layer is removed using a solvent to create a non-planar region with consistent and repeatable results. The at least one layer beneath the AlN layer is insoluble in the solvent and therefore acts as an etch stop, preventing any damage to the at least one layer beneath the AlN layer. Furthermore, should the AlN layer incur any surface damage as a result of the reactive ion etching, the damage will be removed when exposed to the solvent to create the non-planar region.

44 Claims, 6 Drawing Sheets

OTHER PUBLICATIONS

Kim, Jong-Wook, et al., "Microwave Performance of Recessed Gate $Al_{0.2}Ga_{0.8}N$/GaN HFETs Fabricated Using A Photoelectrochemical Etching Technique," *Materials Science and Engineering*, vol. 95, No. 1, pp. 73–76 (Jul. 1, 2002).

Maher, H., et al., "Wet Etching and its Application to the Fabrication and Characterization of AlGaN/GaN HFETs," *IEEE/Cornell Conference on High Performance Devices*, Ithaca, New York, pp. 192–198 ( Aug. 7, 2000).

Mileham, J.R., et al., "Wet Chemical Etching of AlN," *Applied Physics Letters*, vol. 67, No. 8, pp. 1119–1121 (Aug. 21, 1995).

Wu, Yi-Peng, et al., "GaN-Based FETs For Microwave Power Amplification," *IEICE Transactions On Electronics*, vol. E12-C, No. 11, pp. 1895–1905 (Nov. 11, 1999).

* cited by examiner

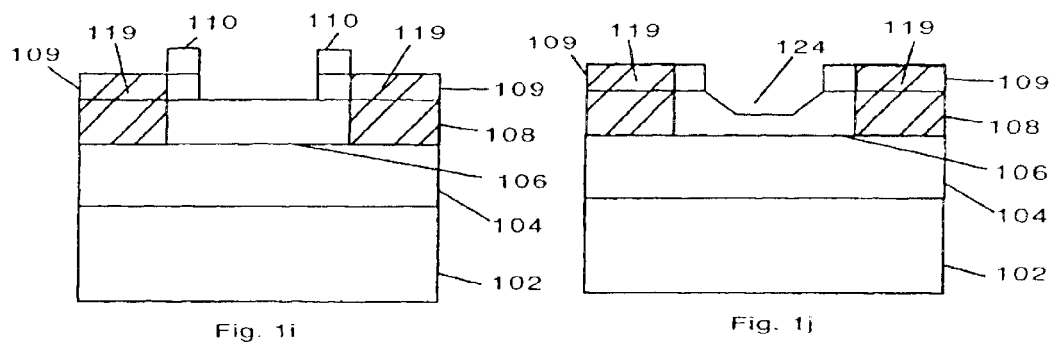
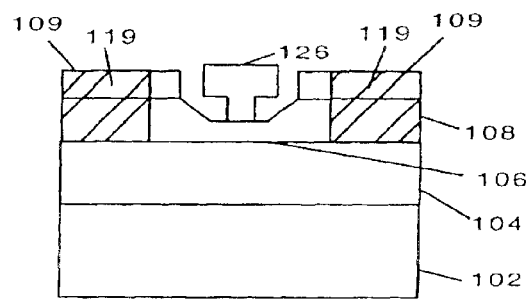

METHOD FOR FABRICATING A NON-PLANAR NITRIDE-BASED HETEROSTRUCTURE FIELD EFFECT TRANSISTOR

CROSS-REFERENCE TO RELATED APPLICATIONS

This application is related to and claims benefit of U.S. Provisional Application No. 60/411,076 filed on Sep. 16, 2002, which is incorporated by reference in its entirety.

FIELD OF THE INVENTION

The present invention relates to a method for fabricating a semiconductor structure useful for fabricating a non-planar heterostructure field effect transistor. More specifically, the present invention relates to a method for fabricating a semiconductor structure useful for fabricating a non-planar nitride-based heterostructure field effect transistor, wherein the non-planar region is fabricated in the group III-nitride material aluminum nitride (AlN) and the semiconductor structure is not damaged by dry etching or wet etching.

BACKGROUND OF THE INVENTION

The use of group III-nitride substrates has become popular for fabricating a non-planar region in a non-planar heterostructure field effect transistor. A non-planar heterostructure field effect transistor is a field effect transistor comprising several different semiconductor layers of semiconductor material, wherein the top layer has a non-planar region. Typically a gate is then formed in the non-planar region. By forming the gate in the non-planar region, the parasitic resistance of the heterostructure field effect transistor is lowered. Furthermore, a higher breakdown voltage and transconductance, as discussed below, can be achieved. However, fabricating a non-planar heterostructure field effect transistor using group III-nitride substrates can be troublesome.

Transconductance is a measure of how the output current of the device changes with the applied voltage at the input of the device. The breakdown voltage is a threshold voltage, which, when exceeded, causes current in the gate to flow uncontrollably. This ultimately leads to the destruction of the device. The breakdown voltage is directly related to the bandgap as described above. Another benefit of having a higher breakdown voltage is improved gate modulation of the channel under a strong RF input drive, which improves power performance of the transistor.

The use of group III-nitride substrates to fabricate a non-planar region in the top layer is popular because group III-nitride substrates have much higher bandgaps than more traditional substrates such as silicon. The bandgap of a substrate refers to the degree to which it can support an applied electric field before breaking down. Thus, the applied voltage that a substrate can maintain is directly proportional to the bandgap of the substrate.

Previous attempts have been made to fabricate a non-planar heterostructure field effect transistor with a top layer comprising GaN, a group III-nitride substrate. However, using GaN has presented problems. When using a wet-etch there is no reliable or controllable method for controlling the regions in the GaN which are being etched. As a result, if the GaN layer is overetched, the layers beneath the GaN layer would be damaged by the wet etchant. There have also been attempts at fabricating a non-planar region in AlGaN where the AlGaN layer was partially wet-etched. Like GaN, using a wet-etch with AlGaN presented problems with controlling the area being etched and the depth of the etched area.

Dry etching processes have also been used in an attempt to create a non-planar region in a GaN substrate. However, dry etching introduces unrecoverable damage to the surface of the GaN substrate. Similar damage is also present when using an AlGaN substrate. The surface damage can be repaired by a post-annealing process, but removing all the surface damage is not possible. Another problem with dry-etching in GaN and AlGaN is the difficulty in controlling the etch depth. Techniques attempting to fabricate recessed gates using GaN are discussed in J. W. Burm et al., "Recessed gate GaN MODFETS," Solid-State Electronics vol 41, pp. 247–250 (1997), and T. Egawa et al., "Recessed gate AlGaN/GaN MODFET on Sapphire grown by MOCVD," IEDM tech Digest, pp. 401–404 (1999). These references both use dry-etching techniques to fabricate the recessed gate.

Therefore, there is a need for a method for fabricating a non-planar heterostructure field effect transistor, wherein the non-planar region is fabricated in a group III-nitride material. There is also a need for a non-planar heterostructure field effect transistor in which dry-etching and wet-etching techniques can be used to create the non-planar region which does not induce damage to the transistor and allows good control of the etching depth.

SUMMARY OF THE INVENTION

The present invention provides a transistor having a device structure that allows for the use of dry-etching and wet-etching to create a non-planar region without damaging the transistor. The present invention makes use of the group III-nitride material AlN for creating a non-planar region. AlN has not been used for this application because of the focus on GaN. Because GaN has one of the highest bandgaps of any group III-nitride material, it has been more desirable to find a compatible wet etching process that will work with GaN, than it is to attempt the process with a different group III-nitride material. However, when AlN along with the device structure of the transistor disclosed herein, is processed in conjunction with the wet-etching and dry-etching process disclosed herein, a non-planar region can be fabricated consistently and repeatedly without inducing damage to the rest of the transistor. Such results have not been attainable using GaN or other group III-nitride materials to fabricate non-planar regions in heterostructure field effect transistors.

It is an object of the present invention to provide a novel method for fabricating a non-planar nitride-based heterostructure field effect transistor. The present invention provides a substrate, whereon at least one layer of semiconductor material is deposited. A layer of AlN is deposited on the at least one layer. An active channel is created at the interface of the AlN layer and the at least one layer. Charges are induced in the channel by both spontaneous polarization and piezoelectric strain at the interface. Furthermore, the at least one layer may further consist of a plurality of layers of different semiconductor material. The interface created by the plurality of layers of semiconductor material serves as the channel of the transistor.

After depositing the AlN layer, a capping layer is preferably deposited on the AlN layer. The capping layer helps prevents oxidation from forming on the AlN layer. Ohmic metal contacts are deposited on the capping layer by metal evaporation. The ohmic metal contacts are then annealed so that they diffuse into the transistor, where they contact the channel. The ohmic metal contacts may then be used as a source and drain for the transistor.

Next, a portion of the capping layer is removed using a reactive ion etch (a dry etch) to expose a portion of the AlN layer. However, the exposed portion of the AlN layer is not removed by the dry-etch, thereby acting as an etch stop and preventing damage to the layers of semiconductor material beneath the AlN layer caused by the dry-etch. Then, by using the remaining portion of the capping layer as a mask, a portion of the AlN layer is removed with a solvent to create a non-planar region. The solvent can remove the desired portion of the AlN layer with predictable and repeatable results without reducing the performance of the transistor caused by damage to the AlN layer. Using the solvent to etch the AlN layer helps remove any surface damage on the AlN layer induced by the reaction ion etch. Also, the layers of semiconductor material beneath the AlN layer are insoluble in the solvent. As a result, the layers of semiconductor material work as a controllable etch stop for etching AlN, thereby preventing damage to the semiconductor layers beneath the AlN layer.

BRIEF DESCRIPTION OF THE DRAWINGS

First Embodiment

FIG. 1i shows the removal of a portion of the capping layer;

FIG. 1j shows the non-planar gate region; and

FIG. 1k shows the gate deposited in the non-planar gate region.

Second Embodiment

Figure 2A:
Figure 2B:
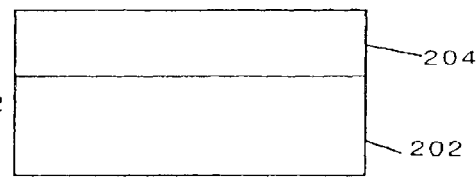
Figure 2C:
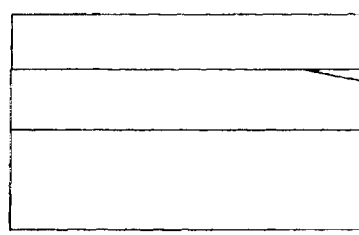
Figure 2D:
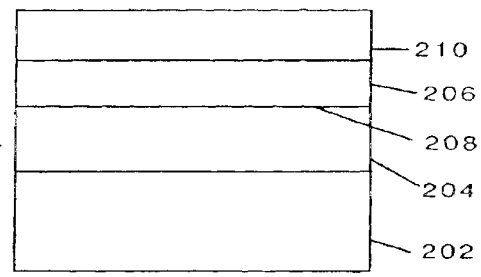
Figure 2E:
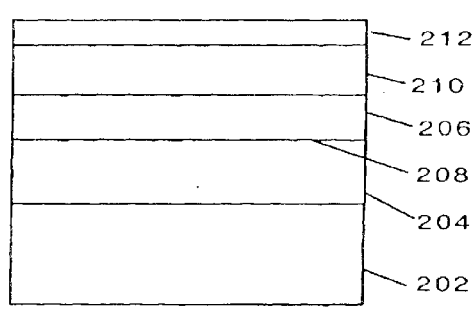
Figure 2F:
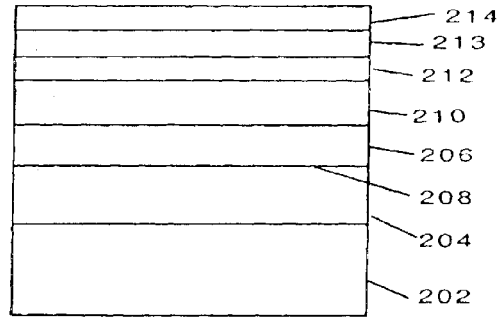
Figure 2G:
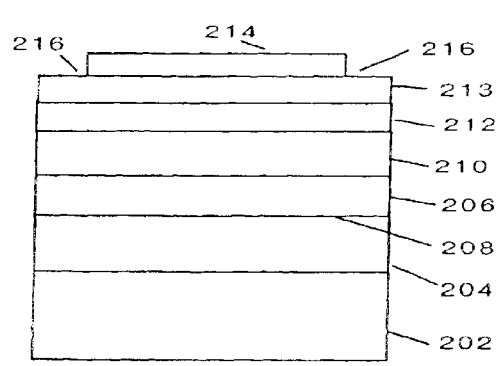
Figure 2H:
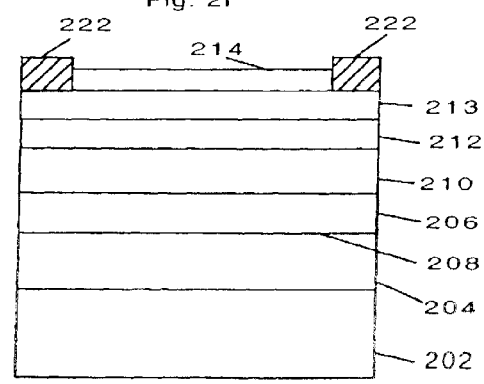
Figure 2I:
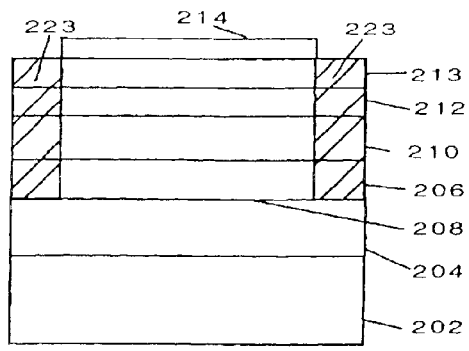
Figure 2J:
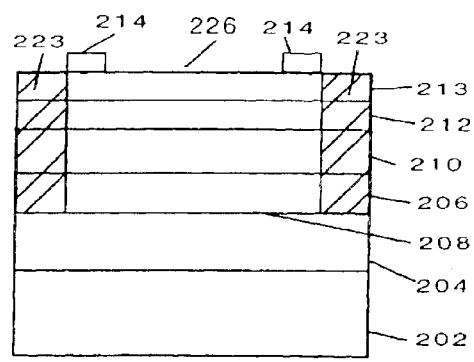
Figure 2K:
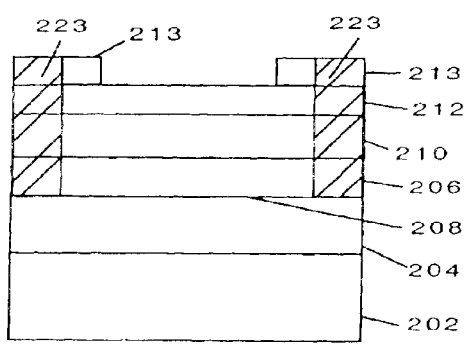
Figure 2L:
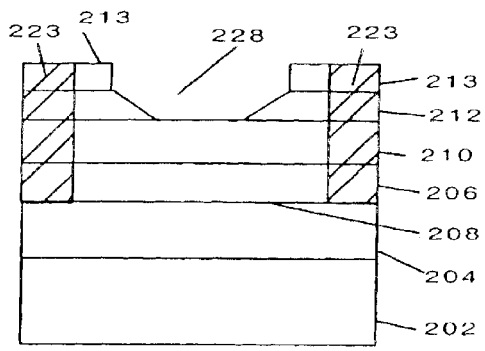

FIG. 2a shows a substrate of the second embodiment;

FIG. 2b shows a first layer deposited on the substrate;

FIG. 2c shows a second layer deposited on the first layer, and the interface;

FIG. 2d shows the third layer deposited on the second layer;

FIG. 2e shows the AlN layer deposited on the third layer;

FIG. 2f shows the capping layer and photoresist layer deposited on the AlN layer;

FIG. 2g shows the removal of a portion of the photoresist layer;

FIG. 2h shows the ohmic metal contacts deposited on the capping layer;

FIG. 2i shows the ohmic metal regions in the capping layer, AlN layer, second layer, and third layer;

FIG. 2j shows a portion of the photoresist layer removed;

FIG. 2k shows a portion of the capping layer removed;

FIG. 2l shows the non-planar gate region; and

Figure 2M:
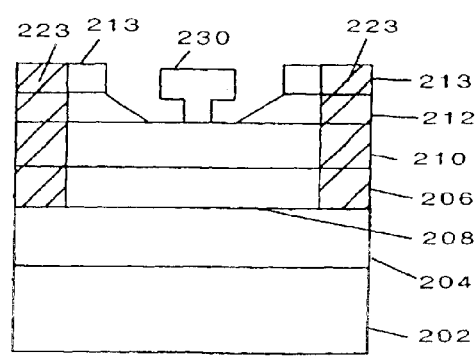

FIG. 2m shows the gate deposited in the non-planar gate region.

Third Embodiment

Figure 3A:
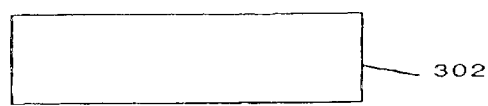
Figure 3B:
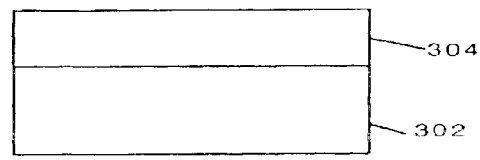
Figure 3C:
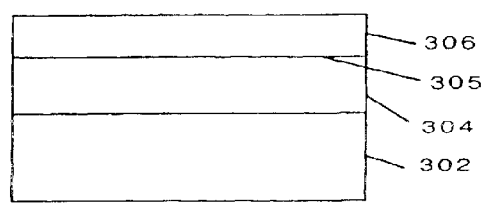
Figure 3D:
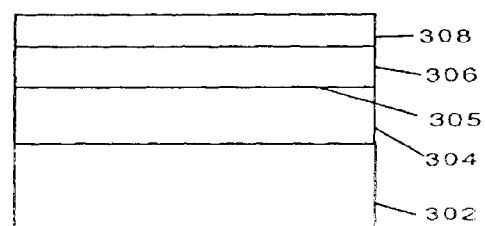

FIG. 3a shows the substrate;

FIG. 3b shows the first layer deposited on the substrate;

FIG. 3c shows the second layer deposited on the first layer;

FIG. 3d shows the AlN layer deposited on the second layer

Figure 3E:
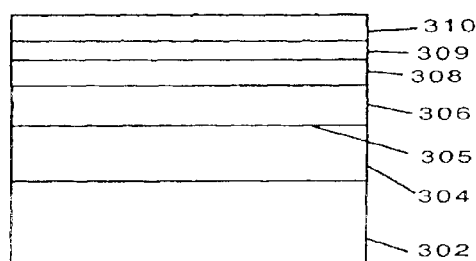
Figure 3F:
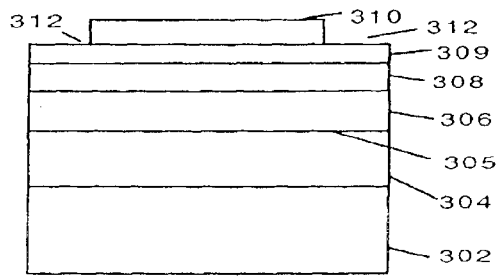
Figure 3G:
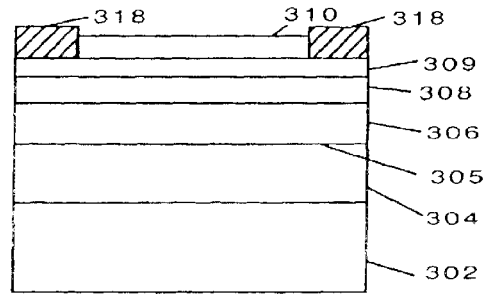
Figure 3H:
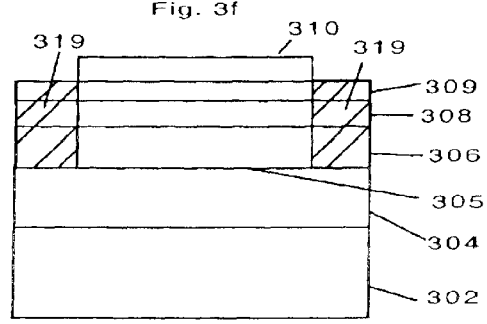
Figure 3I:
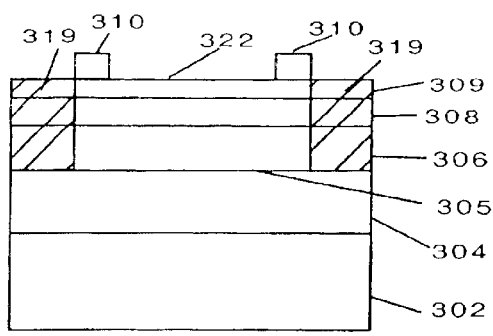
Figure 3J:
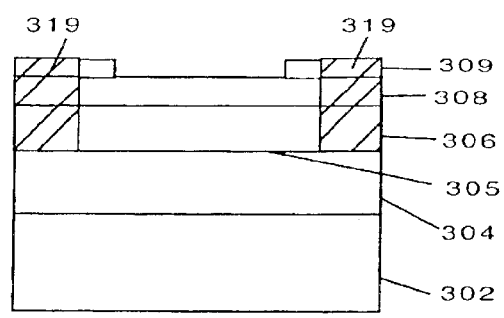

FIG. 3e shows the capping layer and photoresist layer deposited on the AlN layer;

FIG. 3f shows a portion of the photoresist removed;

FIG. 3g shows ohmic metal contacts deposited on the capping layer;

FIG. 3h shows the ohmic metal regions in the capping layer, AlN layer, and second layer;

FIG. 3i shows a portion of the photoresist layer on the capping layer removed;

FIG. 3j shows a portion of the capping layer removed

Figure 3K:
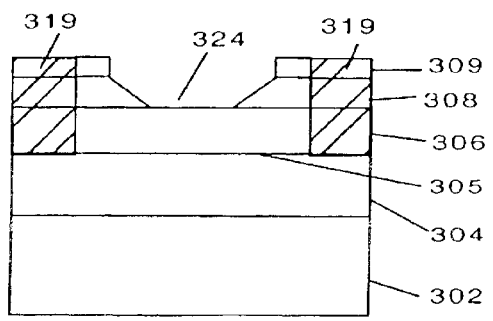

FIG. 3k shows the non-planar gate region; and

Figure 3L:
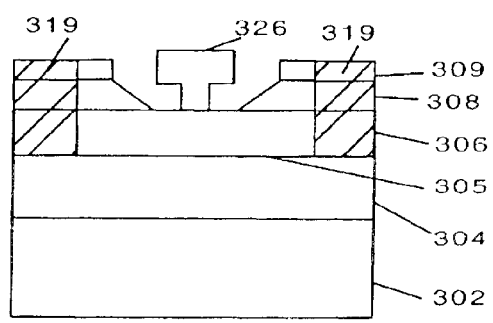

FIG. 3l shows the gate deposited in the non-planar gate region.

DETAILED DESCRIPTION OF EMBODIMENTS

The present invention will now be described more fully hereinafter with reference to the accompanying drawings in which preferred embodiments of the invention are shown. This invention may be embodied in many different forms and should not be construed as limited to the embodiments set forth herein.

First Embodiment

Figure 1A:
FIG. 1a shows the substrate according to a first embodiment.
Figure 1B:
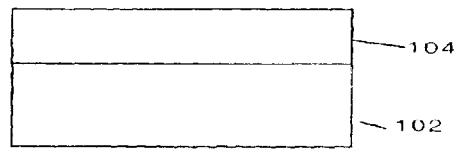
FIG. 1b shows the first layer deposited on the substrate.
Figure 1C:
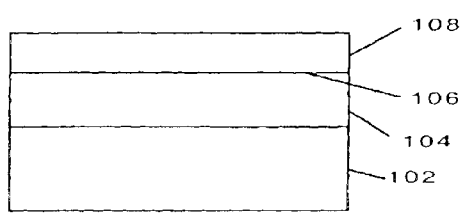
FIG. 1c shows the AlN layer deposited on the first layer and the interface.
Figure 1D:
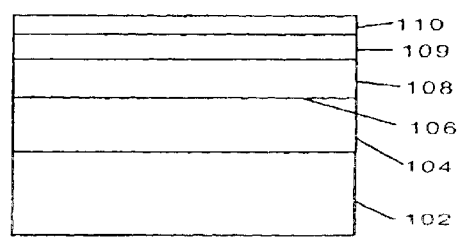
FIG. 1d shows the capping layer and photoresist deposited on the AlN layer.

A method useful for fabricating a non-planar nitride-based heterostructure field effect transistor according to a first embodiment of the present invention is described with reference to FIGS. 1a–1k. In this first embodiment, a substrate 102 is provided as shown in FIG. 1a. The substrate 102 preferably comprises sapphire, silicon carbide, or GaN. Next, a first layer 104 is provided as shown in FIG. 1b. The first layer 104 is deposited, preferably epitaxially, on the substrate 102. The first layer 104 preferably comprises GaN, however other materials such as InP or InGaN can be used as well. Next, an AlN layer 108 is provided as shown in FIG. 1c. The AlN layer 108 is preferably deposited epitaxially on the first layer 104. The AlN layer 108 has a thickness of preferably not more than 10 nm. When the AlN layer 108 is deposited on the first layer 104, an interface 106 is created as shown in FIG. 1c. The interface 106 serves as the channel of the transistor, which will be discussed later. After the AlN layer 108 is deposited, a capping layer 109 is preferably deposited on the AlN layer 108 as shown in FIG. 1d, followed by a layer of photoresist 110. The capping layer 109 preferably comprises GaN and helps prevent oxidation from forming on the AlN layer 108 during subsequent processing steps.

Figure 1E:
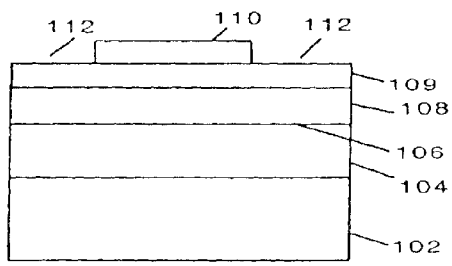
FIG. 1e shows a portion of the photoresist layer removed.
Figure 1F:
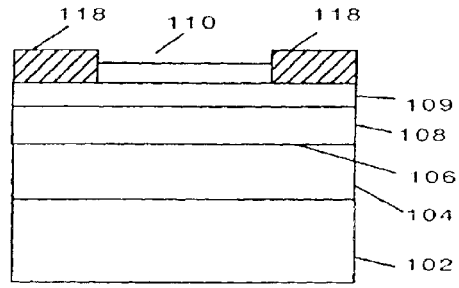
FIG. 1f shows the ohmic metal contacts deposited on the capping layer.
Figure 1G:
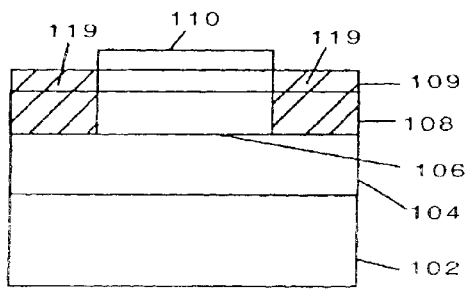
FIG. 1g shows the ohmic contact regions.

Next, a portion of the photoresist layer 110 is patterned and removed using techniques well-known in the art, to create first windows 112, which expose part of the surface of the capping layer 109 as shown in FIG. 1e. Ohmic metal contacts 118 are deposited in the first windows 112 on the surface of the capping layer 109 using metal evaporation as shown in FIG. 1f. The ohmic metal contacts 118 can be comprised of a combination of Ti/Al or Ta/Ti/Al, which are deposited in that order and are about 320 nm thick. The ohmic metal contacts 118 are then annealed at a temperature in the range of about 600–800° C. for about a minute. This allows the ohmic metal contacts 118 to diffuse into the capping layer 109 and AlN layer 108, thereby creating an ohmic contact region 119 as shown in FIG. 1g. The ohmic metal contact region 119 can then be used as a source and a drain.

Figure 1H:
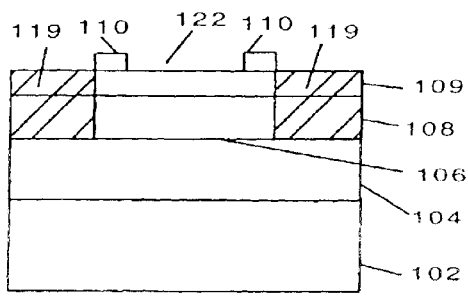
FIG. 1h shows the second window to expose a portion of the capping layer.

Next, the remaining portion of the photoresist layer 110 on the AlN layer 108 is pattern to create a second window 122 as show in FIG. 1h. The second window 122 exposes part of the capping layer 109. The exposed portion of the capping layer 109 is etched away using a reactive ion etch preferably with chlorine gas at an etch rate of about 72 nm/min. Etching away a portion of the capping layer 109 exposes a portion of the surface of the AlN layer 108 as shown in FIG. 1i, however the reactive ion etching does not remove any portion of the AlN layer 108. The AlN layer 108 effectively acts as an etch stop, thereby preventing the reactive ion etch from damaging the first layer 104 beneath the AlN layer 108. It is possible though, for the exposed portion of the surface of the AlN layer 108 to incur damage caused by the reactive ion etch. Also, the remaining portion of the photoresist layer 110 is removed using techniques known in the art. Next, using the remaining portion of the capping layer 109 as a mask, the exposed portion of the AlN layer 108 is etched away at room temperature with a solvent to create a non-planar gate region 124 as shown in FIG. 1j. The solvent preferably comprises potassium hydroxide (KOH), water, and potassium borates, and is sold under the trade name AZ-400 by the Clariant Corporation of Somerville, N.J. Etching the AlN layer 108 helps removes any surface damage on the AlN layer 108 caused by the reactive ion etching of the capping layer 109. AZ-400 has an etch rate of approximately 100 Å/min.

Finally, a gate 126 is deposited in the non-planar gate region 124 as shown in FIG. 1k. The gate 126 is preferably T-shaped to help reduce intrinsic resistance. Fabricating a T-shaped structure is a technique well known in the art.

Because the AlN layer 108 and first layer 104 are comprised of group III-V materials, the interface 106 between the AlN layer 108 and first layer 104 already contains carrier charges due to the well-known effects of spontaneous polarization. In this way, the interface 106 acts as a channel for the transistor without requiring any additional doping. However, additional doping can be provided, if desired. When the transistor is biased with a voltage at the gate 126, and at either of the ohmic contact regions 119, the carrier charges at the interface 106 flow between the ohmic contact regions 119 allowing operation of the non-planar heterostructure field effect transistor.

Second Embodiment

A method for fabricating a non-planar heterostructure field effect transistor according to a second embodiment of the present invention is described with reference to FIGS. 2a–2m. In this embodiment a substrate 202 as shown in FIG. 2a is provided. The substrate 202 preferably comprises sapphire, silicon carbide, or GaN. A first layer 204 is deposited, preferably epitaxially, on the substrate 202 as shown in FIG. 2b. The first layer 204 preferably comprises GaN, however other materials such as InN or InGaN can be used as well. A second layer 206 is deposited, preferably epitaxially, on the first layer 204. The second layer 206, as shown in FIG. 2c, preferably comprises AlGaN. By depositing the second layer 206 on top of the first layer 204, an interface 208 is created. The interface 208 is located where the first layer 204 contacts the second layer 206 and is further discussed later. A third layer 210 is deposited, preferably epitaxially, on the surface of the second layer 206 as shown in FIG. 2d. This third layer 210 preferably comprises GaN. The purpose of the third layer 210 will be discussed later. After the third layer 210 is deposited, an AlN layer 212 is deposited preferably epitaxially as shown in FIG. 2e. The AlN layer 212 is preferably no greater than 10 nm thick. Finally, a capping layer 213 as shown in FIG. 2f is preferably deposited on the AlN layer 212, followed by a photoresist layer 214. The purpose of the capping layer 213 is to prevent oxidation from forming on the surface of the AlN layer 212 during subsequent processing steps.

After depositing the photoresist layer 214, a portion of the photoresist layer 214 is patterned, and removed using techniques known in the art to create first windows 216, which expose part of the surface of the capping layer 213 as shown in FIG. 2g.

Next, ohmic metal contacts 222 are deposited in the first windows 216 as shown in FIG. 2h. The ohmic metal contacts 222 can be comprised of a combination of Ti/Al or Ta/Ti/Al, which are deposited in that order and are about 320 nm thick. The ohmic metal contacts 222 are annealed at a temperature in the range of about 600–800° C. for about a minute. This allows the ohmic metal contacts 222 to diffuse into the capping layer 213, the AlN layer 212, the third layer 210, and the second layer 206, creating an ohmic contact region 223 as shown in FIG. 2i. The ohmic contact region 223 can then be used as a source and a drain.

Next, a portion of the remaining photoresist layer 214 is patterned and removed using techniques well-known in the art, creating a second window 226, as shown in FIG. 2j. The second window 226 exposes part of the capping layer 213. The exposed portion of the capping layer 213 is etched away using a reactive ion etch preferably with chlorine gas at an etch rate of about 72 nm/min. Etching away a portion of the capping layer 213 exposes a portion of the surface of the AlN layer 212 as shown in FIG. 2k, however the reactive ion etching does not remove any portion of the AlN layer 212. The AlN layer 212 effectively acts as an etch stop, thereby preventing the reactive ion etch from removing portions of the first, second, or third layers 204, 206, 210 beneath the AlN layer 212. It is possible though, for the exposed portion of the surface of the AlN layer 212 to incur damage caused by the reactive ion etch. Also, the remaining portion of the photoresist layer 214 is removed using techniques known in the art. Next, using the remaining portion of the capping layer 213 as a mask, a portion of the exposed surface of the AlN layer 212 is removed with a solvent to create a non-planar gate region 228 as shown FIG. 2l. The solvent preferably comprises potassium hydroxide (KOH), water, and potassium borates, and is sold under the trade name AZ-400 by the Clariant Corporation of Somerville, N.J. Etching the AlN layer 212 helps removes any surface damage on the AlN layer 212 caused by the reactive ion etching of the capping layer 213. As shown in FIG. 2l, the non-planar gate region 228 is created by completely etching away a portion of the AlN layer 212. However, this embodiment would work if the AlN layer 212 was not completely etched away as shown in FIG. 1j of the first embodiment. In the first embodiment, the AlN layer 108 was not completely etched away. However, should a portion of the AlN layer 212 be completely etched through to the third layer 210 as shown in FIG. 2l, the substrate layers located beneath the AlN layer 212 will not be affected by the AZ-400 solution. In this second embodiment, the third layer 210 preferably comprises GaN. GaN is insoluble in AZ-400 and effectively acts as an etch stop, preventing the AZ-400 from damaging the layers located under the AlN layer 212.

A gate 230 is then deposited in the non-planar gate region 228 as shown in FIG. 2m. The gate 230 is preferably T-shaped to help reduce intrinsic resistance and capacitance. Fabricating a T-shaped structure is a technique well-known in the art.

Because the first layer 204 and the second layer 206 are comprised of group III–V materials, the interface 208 between the first layer 204 and the second layer 206 already contains carrier charges due to the well-known effects of spontaneous polarization. In this way, the interface 208 acts as a channel for the transistor without requiring any additional doping. However, additional doping can be provided, if desired. When the transistor is biased with a voltage at the gate 230 and at either of the ohmic contact regions 223, the charges at the interface 208 flow between the ohmic contact regions 223, allowing operation of the non-planar heterostructure field effect transistor.

Third Embodiment

A method for fabricating a non-planar heterostructure field effect transistor according to a third embodiment is described with reference to FIGS. 3a–3l. In this embodiment, a substrate 302 is provided as shown in FIG. 3a. The substrate 302 preferably comprises sapphire, silicon carbide, or GaN. Next, a first layer 304 preferably comprising GaN is provided as shown in FIG. 3b, however, other materials such as InN or InGaN could work equally as well. The first layer 304 is deposited, preferably epitaxially, on the substrate 302. A second layer 306 is provided as shown in FIG. 3c. The second layer 306 preferably comprises AlGaN and is deposited, preferably epitaxially, on the first layer 304. By depositing the second layer 306 on the first layer 304, an interface 305 is created. The interface 305 is located where the first layer 304 contacts the second layer 306 and is further discussed later. Next, an AlN layer 308 is deposited, preferably epitaxially on the second layer 306 as shown in FIG. 3d. The AlN layer 308 is preferably no greater than 10 nm thick. Finally, a capping layer 309 preferably comprising GaN, is preferably deposited on the AlN layer 308, followed by a photoresist layer 310 as shown in FIG. 3e. The purpose of the capping layer 309 is to prevent oxidation from forming on the surface of the AlN layer 308 during subsequent processing steps.

Next, the photoresist layer 310 is patterned and removed using techniques well known in the art to create first windows 312, which expose part of the surface of the capping layer 309 as shown in FIG. 3f. Ohmic metal contacts 318 are deposited in the first windows 312 using metal evaporation as shown in FIG. 3g. The ohmic metal contacts 318 can be comprised of a combination of Ti/Al or Ta/Ti/Al, which are deposited in that order and are about 320 nm thick. The ohmic metal contacts 318 are annealed at a temperature in the range of about 600–800° C. for about a minute. This allows the ohmic metal contacts 318 to diffuse into the capping layer 309, the AlN layer 308, and the second layer 306, creating an ohmic contact region 319 as shown in FIG. 3h. The ohmic contact region 319 can then be used as a source and a drain.

Next, a portion of the remaining photoresist layer 310 is patterned and removed as shown in FIG. 3i using techniques well-known in the art, to create a second window 322. The second window 322 exposes part of the capping layer 309 as shown in FIG. 3i The exposed portion of the capping layer 309 is removed using a reactive ion etch preferably with chlorine gas at an etch rate of about 72 nm/min. Etching away a portion of the capping layer 309 exposes a portion of the surface of the AlN layer 308 as shown in FIG. 3j, however the reactive ion etching does not remove any portion of the AlN layer 308. The AlN layer 308 effectively acts as an etch stop to the reactive ion etching, thereby preventing the reactive ion etch from damaging the first or second layers 304, 306 beneath the AlN layer 308. It is possible though, for the exposed portion of the surface of the AlN layer 308 to incur damage caused by the reactive ion etch. Also, the remaining portion of the photoresist layer 310 is removed using techniques known in the art. Next, using the remaining portion of the capping layer 309 as a mask, a portion of the exposed AlN layer 308 is etched away with a solvent to create a non-planar gate region 324 as shown in FIG. 3k. The solvent preferably comprises potassium hydroxide (KOH), water, and potassium borates, and is sold under the tradename AZ-400 by the Clariant Corporation of Somerville, N.J. Etching the AlN layer 308 also helps removes any surface damage on the AlN layer 308 caused by the reactive ion etching of the capping layer 309. As shown in FIG. 3k the non-planar gate region 324 is created by completely etching a portion of the AlN layer 308 through to the second layer 306. However, this embodiment would work if the AlN layer 308 was not completely etched away as shown in FIG. 1j of the first embodiment. In the first embodiment the AlN layer 108 was not completely etched away. However, should the AlN layer 308 be completely etched through to the second layer 306 as shown in FIG. 3k, the layers located beneath the AlN layer 308 will not be affected by the AZ-400 solution. In this third embodiment, the second layer 306 preferably comprises AlGaN. AlGaN is insoluble in AZ-400 and effectively acts as an etch stop, preventing the AZ-400 from damaging the layers located under the AlN layer 308 should a portion of the AlN layer 308 be completely etched through to the second layer 306.

A gate 326 is deposited in the non-planar gate region 324 as shown in FIG. 3l. The gate 326 is preferably T-shaped in order to help reduce intrinsic resistance and capacitance. Fabricating a T-shaped structure is a technique well-known in the art.

Because the first layer 304 and second layer 306 are comprised of group III–V materials, the interface 305 between the first layer 304 and second layer 306 already contains carrier charges due to the well-known effects of spontaneous polarization. In this way, the interface 305 acts as a channel for the transistor without requiring any additional doping. However, additional doping of the transistor can be provided, if desired. When the transistor is biased with a voltage at the gate 326 and at either of the ohmic contact regions 319, the charges at the interface 305 flow between the ohmic contact regions 319, allowing operation of the non-planar heterostructure field effect transistor.

Let it be understood that the foregoing description is only illustrative of the invention. Various alternatives and modifications can be devised by those skilled in the art without departing from the spirit of the invention. Accordingly, the present invention is intended to embrace all such alternatives, modifications, and variances which fall within the scope of the appended claims.

What is claimed is:

1. A method for fabricating a non-planar nitride-based semiconductor structure, the method comprising the steps of:
   providing a substrate;
   providing an AlN layer;
   providing at least one layer of semiconductor material, the at least one layer being disposed between the substrate and the AlN layer; and
   removing a portion of the AlN layer by exposing the portion of the AlN layer to a solvent, thereby creating a non-planar region in the AlN layer, wherein the at least one layer of semiconductor material is insoluble in the solvent.

2. The method of claim 1, wherein the substrate comprises a material selected from the group consisting of sapphire, silicon carbide, and GaN.

3. The method of claim 1, further comprising the steps of:
   depositing a capping layer comprising GaN on the AlN layer; and
   removing a portion of the capping layer using reactive ion etching to expose the portion of the AlN layer, thereby creating a mask for the step of removing a portion of the AlN layer, wherein the reactive ion etching does not remove the portion of the AlN layer thereby protecting the at least one layer of semiconductor material, and wherein the step of removing a portion of the AlN layer removes any surface damage to the AlN layer induced by the reactive ion etching.

4. The method of claim 1, wherein the AlN layer is no greater than 10 nanometers thick and is deposited epitaxially.

5. The method of claim 1, further comprising the step of depositing a gate in the non-planar region.

6. The method of claim 3, wherein the solvent is a potassium hydroxide based solvent.

7. The method of claim 6, wherein the potassium hydroxide based solvent further comprises potassium borates and water.

8. The method of claim 6, further comprising the steps of:
depositing ohmic metal contacts on the capping layer; and
heating the ohmic metal contacts, thereby diffusing the ohmic metal contacts into the capping layer and the AlN layer.

9. The method of claim 8, wherein the step of providing at least one layer comprises the step of epitaxially depositing a first layer comprising GaN.

10. The method of claim 9, further comprising an active channel, the active channel located at an interface of the AlN layer and the first layer.

11. The method of claim 9, wherein the step of providing at least one layer further comprises the step of epitaxially depositing a second layer comprising AlGaN, the second layer being disposed between the first layer and the AlN layer.

12. The method of claim 11, wherein the step of depositing a second layer creates an active channel, the active channel being located at an interface of the first layer and the second layer.

13. The method of claim 11, wherein the step of diffusing the ohmic metal contacts into the capping layer and AlN layer further comprises the step of diffusing the ohmic metal contacts into the second layer.

14. The method of claim 11, wherein the step of providing at least one layer further comprises the step of epitaxially depositing a third layer comprising GaN, the third layer being disposed between the second layer and the AlN layer.

15. The method of claim 14, wherein the step of diffusing the ohmic metal contacts further comprises the step of diffusing the ohmic metal contacts into the second layer and the third layer.

16. A method for fabricating a non-planar nitride-based semiconductor structure, the method comprising the steps of:
providing a substrate;
providing an AlN layer;
providing at least one layer of semiconductor material, the at least one layer being disposed between the substrate and the AlN layer;
depositing a capping layer comprising GaN on the AlN layer;
removing a portion of the AlN layer by exposing the portion of the AlN layer to a solvent, thereby creating a non-planar region in the AlN layer, wherein the at least one layer of semiconductor material is insoluble in the solvent; and
removing a portion of the capping layer using reactive ion etching to expose the portion of the AlN layer, thereby creating a mask for the step of removing a portion of the AlN layer, wherein the reactive ion etching does not remove the portion of the AlN layer thereby protecting the at least one layer of semiconductor material, and wherein any surface damage on the AlN layer induced by the reactive ion etching is removed during the step of removing a portion of the AlN layer.

17. The method of claim 16, wherein the substrate comprises a material selected from the group consisting of sapphire, silicon carbide, and GaN.

18. The method of claim 16, wherein the AlN layer is preferably no greater than 10 nanometers thick and is deposited epitaxially.

19. The method of claim 16, further comprising the step of depositing a gate in the non-planar region.

20. The method of claim 16, wherein the solvent is a potassium hydroxide based solvent.

21. The method of claim 20, wherein the potassium hydroxide based solvent further comprises potassium borates and water.

22. The method of claim 16, further comprising the steps of:
depositing ohmic metal contacts on the capping layer; and
heating the ohmic metal contacts, thereby diffusing the ohmic metal contacts into the capping layer and the AlN layer.

23. The method of claim 22, wherein the step of providing at least one layer comprises the step of epitaxially depositing a first layer comprising GaN.

24. The method of claim 23, further comprising an active channel, the active channel located at an interface of the AlN layer and the first layer.

25. The method of claim 23, wherein the step of providing at least one layer further comprises the step of epitaxially depositing a second layer comprising AlGaN, the second layer being disposed between the first layer and the AlN layer.

26. The method of claim 25, wherein the step of depositing a second layer creates an active channel, the active channel being located at an interface of the first layer and the second layer.

27. The method of claim 25, wherein the step of diffusing the ohmic metal contacts into the capping layer and AlN layer further comprises the step of diffusing the ohmic metal contacts into the second layer.

28. The method of claim 25, wherein the step of providing at least one layer further comprises the step of epitaxially depositing a third layer comprising GaN, the third layer being disposed between the second layer and the AlN layer.

29. The method of claim 28, wherein the step of diffusing the ohmic metal contacts further comprises diffusing the ohmic metal contacts into the second layer and the third layer.

30. A method for fabricating a non-planar nitride-based semiconductor structure, the method comprising the steps of:
providing a substrate;
providing an AlN layer;
providing at least one layer of semiconductor material, the at least one layer being disposed between the substrate and the AlN layer; and
removing a portion of the AlN layer by exposing the portion of the AlN layer to an etchant, thereby creating a non-planar region in the AlN layer, wherein the at least one layer of semiconductor material is impervious to the etchant.

31. The method of claim 30, wherein the substrate comprises a material selected from the group consisting of sapphires silicon carbide, and GaN.

32. The method of claim 30, further comprising the steps of:
   depositing a capping layer comprising GaN on the AlN layer; and
   removing a portion of the capping layer using reactive ion etching to expose the portion of the AlN layer, thereby creating a mask for the step of removing a portion of the AlN layer, wherein the reactive ion etching does not remove the portion of the AlN layer thereby protecting the at least one layer of semiconductor material, and wherein the step of removing a portion of the AlN layer removes any surface damage to the AlN layer induced by the reactive ion etching.

33. The method of claim 30, wherein the AlN Layer is no greater than 10 nanometers thick and is deposited epitaxially.

34. The method of claim 30, further comprising the step of depositing a gate in the non-planar region.

35. The method of claim 32, wherein the etchant is a potassium hydroxide based solvent.

36. The method of claim 35, wherein the potassium hydroxide based solvent further comprises potassium borates and water.

37. The method of claim 35, further comprising the steps of:
   depositing ohmic metal contacts on the capping layer; and
   healing the ohmic metal contacts, thereby diffusing the ohmic metal contacts into the capping layer and the AlN layer.

38. The method of claim 37, wherein the step of providing at least one layer comprises the step of epitaxially depositing a first layer comprising GaN.

39. The method of claim 38, further comprising an active channel, the active channel located at an interface of the AlN layer and the first layer.

40. The method of claim 38, wherein the step of providing at least one layer further comprises the step of epitaxially depositing a second layer comprising AlGaN, the second layer being disposed between the first layer and the AlN layer.

41. The method of claim 40, wherein the step of depositing a second layer creates an active channel, the active channel being located at an interface of the first layer and the second layer.

42. The method of claim 40, wherein the step of diffusing the ohmic metal contacts into the capping layer arid AlN layer further comprises the step of diffusing the ohmic metal contacts into the second layer.

43. The method of claim 40, wherein the step of providing at least one layer further comprises the step of epitaxially depositing a third layer comprising GaN, the third layer being disposed between the second layer end the AlN layer.

44. The method of claim 43, wherein the step of diffusing the ohmic metal contacts further comprises the step of diffusing the ohmic metal contacts into the second layer and the third layer.

* * * * *